United States Patent [19]
Watson et al.

[11] Patent Number: 5,369,640
[45] Date of Patent: Nov. 29, 1994

[54] METHOD AND APPARATUS FOR CLOCK SKEW REDUCTION THROUGH REMOTE DELAY REGULATION

[75] Inventors: Richard B. Watson, Harvard; Russell Iknaian, Groton; Hansel A. Collins, Clinton, all of Mass.

[73] Assignee: Digital Equipment Corporation, Maynard, Mass.

[21] Appl. No.: 49,019

[22] Filed: Apr. 16, 1993

[51] Int. Cl.$^5$ .................. H03K 5/135; H03K 5/14
[52] U.S. Cl. ........................ 371/1; 371/15.1; 307/409; 327/141; 327/292
[58] Field of Search ............... 371/1, 15.1, 20.1, 20.2, 371/23, 22.3, 29.1, 22.1; 324/158 R; 307/269, 409; 364/489

[56] References Cited
U.S. PATENT DOCUMENTS

| | | | |
|---|---|---|---|
| 4,916,388 | 4/1990 | Sano | 371/22.3 |
| 5,198,758 | 3/1993 | Iknaian et al. | 324/158 R |
| 5,258,660 | 11/1993 | Nelson et al. | 307/269 |
| 5,272,729 | 12/1993 | Bechade et al. | 371/1 X |
| 5,294,842 | 3/1994 | Iknaian et al. | 307/269 |

Primary Examiner—Emanuel T. Voeltz
Assistant Examiner—Edward J. Pipala
Attorney, Agent, or Firm—Albert B. Cefalo; Denis G. Maloney

[57] ABSTRACT

A remote delay regulator circuit measures the effects of intrinsic propagation delays experienced by a system clock signal propagating through an extended clock distribution path that encompasses a clock repeater chip, a module transmission network and a clock distribution network of an integrated circuit (IC) chip associated with a clock repeater chip. Circuits of the remote delay regulator are contained on the repeater chip and on the associated IC chip. Delay measurement of the remote IC clock distribution network is provided by sensing the clock signal at the beginning of the network using a BEFORE sense tap and at the end of the network using an AFTER sense tap. The BEFORE and AFTER sense taps are routed to a signal generation circuit on the repeater chip where measurement signals are generated that define the beginning and end of a measurement cycle. A clock delay path circuit on the repeater chip contains the logic circuitry required to measure and compensate for the intrinsic propagation delays of the repeater chip, the transmission network and the IC chip. The logic circuitry includes a measurement latch circuit and a measurement delay line having tapped outputs coupled to the latch circuit.

20 Claims, 12 Drawing Sheets

METHOD AND APPARATUS FOR CLOCK SKEW REDUCTION THROUGH REMOTE DELAY REGULATION

FIELD OF THE INVENTION

This invention relates generally to the distribution of clock signals in a computer and, more specifically, to the distribution of clock signals to their "points-of-use" in various integrated circuit chips on a computer module with as little skew as possible.

BACKGROUND OF THE INVENTION

In a synchronous computer system having a bidirectional bus, one of the signals transmitted to the bus interface circuits on each module of the system is a clock signal used to control the timing of data transfer operations. Specifically, the clock signal synchronizes the transmission and reception of data between physically separated points on the bus.

For proper operation of the computer system, clock signals should arrive at the bus interface circuitry at the same time; otherwise, reliable data transmission is not ensured. For example, if a bus interface circuit receiving data is "clocked" later than others, the earlier-clocked bus interface circuits may overwhelm the data before it is stored at its proper destination. This lack of simultaneity in reception of the clock signals, i.e., clock skew, directly increases the amount of time that the data must remain stable on the bus to ensure reliable data transmission; this, in turn, increases the time required for each data transfer on the bus and, thus reduces the speed of the bus.

The amount of clock skew introduced into a computer system is a direct function of the variations in propagation delays among clock receiver chips and velocity factor differences in module etch of the system. A chip, i.e., a small piece of silicon on which integrated circuits are formed, typically comprises transistors. In digital logic applications, a transistor switches "on", when saturated, and "off", when nonconducting, to generate full "signal" swings between two power supply voltages. The signals are in the form of "high" and "low" states of the output voltage of the transistor. Propagation delay is affected by the switching speed of the transistor and is highly dependent upon variations in the fabrication process of the chip. In addition, the applied voltage, the operating temperature and the loading conditions of the chip affect its switching speed.

For logic switching applications, the transistors of a chip are typically configured as inverter and buffer circuits. An inverter "inverts" the logic sense of a binary signal; a buffer is used merely for signal amplification. That is, the buffer circuit does not produce any particular logic function since the binary value of the output is the same as the binary value of the input. However, buffering of low-level signals with semiconductor chips to develop high-level digital pulse signals is very susceptible to propagation delay variations due to process, voltage, temperature and loading (PVTL) variations. Differences in propagation delay between clock "buffer" chips in a system directly translate into skew. Removing propagation delay, and thus delay differences, is not physically possible; however, adding delay is.

The problem of clock skew is addressed partly by employing a central system clock source and distributing the clock signals to the respective modules. Distribution is accomplished in a manner such that the clock signals arrive essentially simultaneously at the modules. In each module, the incoming clock signals are typically processed, i.e., shaped and amplified, before use by various integrated circuit (IC) chips on the module. Such processing necessarily delays the signals; the delays can be expected to vary from module to module because of PVTL variations among clock buffer chips. In addition, the clock distribution network located on each IC chip of each module can be expected to vary from chip to chip. These variations contribute significantly to clock skew and the present invention is directed to the reduction of the skew. More specifically, the present invention is directed to delivering low-skew clock signals to points on the IC chip where the clock signals are actually used, i.e., at their "points-of-use".

An example of a technique used to reduce PVTL-caused clock skew is disclosed in an article titled, CLOCK BUFFER CHIP WITH ABSOLUTE DELAY REGULATION OVER PROCESS AND ENVIRONMENTAL VARIATIONS, by Watson et al., from 1992 IEEE Custom Integrated Circuit Conference. Here, a delay regulator circuit of a clock repeater chip located on a computer module performs a precise measurement of the propagation delay of clock signal processed by the repeater chip and adjusts that delay to a standard value prior to distributing the processed clock signal to other IC chips on the module. Each repeater chip provides an interface between a globally-distributed (system) input clock signal and corresponding locally-distributed (module) output clock signals. By adjusting the delay in the chip, a fixed-phase relationship is maintained between the input and output clock signals.

Delay regulation in accordance with the above-described technique is performed with a replica loop circuit on the repeater chip that replicates the internal path delay of that chip. The delay regulator circuit described in this paper could also perform a measurement of the propagation delay of a replica of the internal clock distribution path of each IC chip that receives the processed clock signal. This would require extending the replica loop circuit onto the respective IC chip. This approach could allow the repeater chip to regulate delay originating both in itself and in these respective IC chips, in limited fashion.

However, the extended portion of the replica loop on each IC chip would require a significant number of components to accurately simulate the internal clock distribution network of that IC chip, thereby increasing the size and cost of that chip. Furthermore, each respective IC chip requires an unregulated output buffer which may be subjected to PVTL conditions different from those experienced by the repeater chip and the other IC chips, thereby introducing inaccuracies.

Therefore, it is among the objects of the present invention to provide a technique for remotely measuring, in real time, the effects of propagation delays using the actual clock distribution network of an integrated circuit chip coupled to a clock repeater chip.

Another object of the invention is to minimize the number of logic gates needed to perform remote delay regulation on the integrated circuit chip associated with the repeater chip.

Another object of the invention is to minimize the effective clock skew between points-of-use on different integrated circuit chips throughout a computer system.

Another object of the invention is to provide a technique for inserting delay into a clock distribution network with a very high degree of resolution.

Another object of the invention is to provide a technique for measuring the amount of clock delay requiring insertion from the input of the repeater chip to a point-of-use on the associated integrated circuit chip, i.e., auto ranging, despite the amount of propagation delay in the clock distribution network.

Yet another object of the invention is to minimize the lengths of clock transmission lines traversing a computer module and coupling the integrated circuit chips to the repeater chip.

Still yet another object of the invention is to minimize use of computer-aided-design tools in the design of the associated integrated circuit chip.

SUMMARY OF THE INVENTION

The present invention resides in a method and apparatus for measuring the effects of intrinsic propagation delay experienced by a system clock signal propagating through an extended clock distribution path that encompasses a clock repeater chip, a module transmission network and a clock distribution network of an associated integrated circuit (IC) chip. A remote delay regulator circuit measures the effects of the intrinsic propagation delay and adjusts the system clock signal so as to deliver a low-skew clock signal to the point-of-use on the associated IC chip. Delay adjustment is provided by adding sufficient controlled amounts of delay, i.e., insertion delay, to the system clock signal, thereby maintaining a fixed-phase relationship among all clock signals distributed by a central clock module of a computer system at the points where they interact with a system bus. This effective reduction in clock skew permits a significant increase in the effective speed of the bus.

The amount of insertion delay needed to maintain the fixed-phase relationship is determined by assessing the intrinsic propagation delay of the extended clock path and then substracting this intrinsic delay from an integer number of clock periods. The resulting insertion delay will vary between measurements depending on process, voltage, and temperature ("PVT") variations over time. Thus, as the insertion delay varies with PVT, the delay added to the system clock signal enables that signal to maintain the fixed-phase relationship with respect to other system clock signals at their points-of-use.

A portion of the extended clock path resides on the associated IC chip. Because the PVT conditions vary between different chips, it is not practical to replicate this portion of the extended path on the clock repeater chip. Elimination of PVT discrepancies is achieved by using the actual clock distribution network on the associated IC chip. Sense taps located at the input of the clock network, i.e., the BEFORE signal, and at the point-of-use on the IC chip, i.e., the AFTER signal, relay instances of the system clock signal back to the repeater chip in real time. The difference in time between the BEFORE and AFTER signal instances represents the actual propagation time of the system clock through the IC chip's clock distribution network.

The remaining portions of the extended clock path are replicated on the clock repeater chip. By passing the AFTER signal through these replicated clock path portions, a complete representation of the extended clock path up to the point-of-use is achieved. Although the arrangement of the replicated clock path elements is distinguishable from that of the actual extended clock path elements, the intrinsic propagation delays experienced by signals passing through the elements of these paths are identical, as are the differences between these delays and the integer number of clock periods.

In a preferred embodiment of the invention, a clock delay circuit on the repeater chip contains the logic circuitry required to measure and compensate for the effects of combined intrinsic propagation delays from the repeater chip, the associated IC chip and the clock etch on the module that connects the two chips. The logic circuitry includes a measurement latch circuit and a measurement delay line having tapped outputs coupled to the latch circuit.

Measurement signals that define the beginning and end of a measurement operation are generated by a signal generation circuit. The AFTER clock signal, which is delayed by the associated IC's clock distribution network, is also delayed by circuitry on the repeater chip that replicates clock path delays on that chip. A MEAS_START signal is used as a reference to synchronize a first measurement signal that drives the measurement delay line of the remote delay regulator, i.e., a "MEAS_EDGE" signal, and the BEFORE signal is used to synchronize a second measurement signal that closes the measurement latch circuit, i.e., a "MEAS_FINISH" signal. The tapped outputs of the delay line thus provide an actual measurement of the insertion delay in the extended clock distribution path.

Delay regulation is then provided by passing the input system clock signal through another tapped delay line and selecting a tap corresponding to the amount of delay required to maintain the fixed-phase relationship at the point-of-use on the IC chip. This allows the remote delay regulator to regulate delay originating from the extended clock distribution path. Regulation of the propagation delays involving clock distribution networks located on different IC chips requires a separate remote regulator for each IC chip.

An advantage of the invention is that a portion of the delay regulator is contained on the IC chip receiving the delay-regulated clock signal. Thus, the regulation circuit uses the actual delays in real time in the clock distribution circuits on the associated IC chip including the effects those latter circuits experience due to the process, voltage, temperature and loading conditions.

Another advantage of the invention is that the total clock path can be any length regardless of clock frequency (within an operating range). Since the regulator measurement and insertion circuits use only the time required to move a system clock signal to the boundary of a clock period, the operating range of the invention is extended over a very wide range.

Another advantage of the invention is the use of "the finest granularity logically possible" while maintaining a high level of system accuracy over a wide process range.

Yet another advantage of the invention is that lack of restrictions as to the placement of the associated IC chip with respect to the clock repeater chip. System clock distribution no longer has to be physically radial.

BRIEF DESCRIPTION OF THE DRAWINGS

The above and further advantages of the invention may be better understood by referring to the following description in conjunction with the accompanying drawings, in which.

DETAILED DESCRIPTION OF ILLUSTRATIVE EMBODIMENTS

Figure 1:
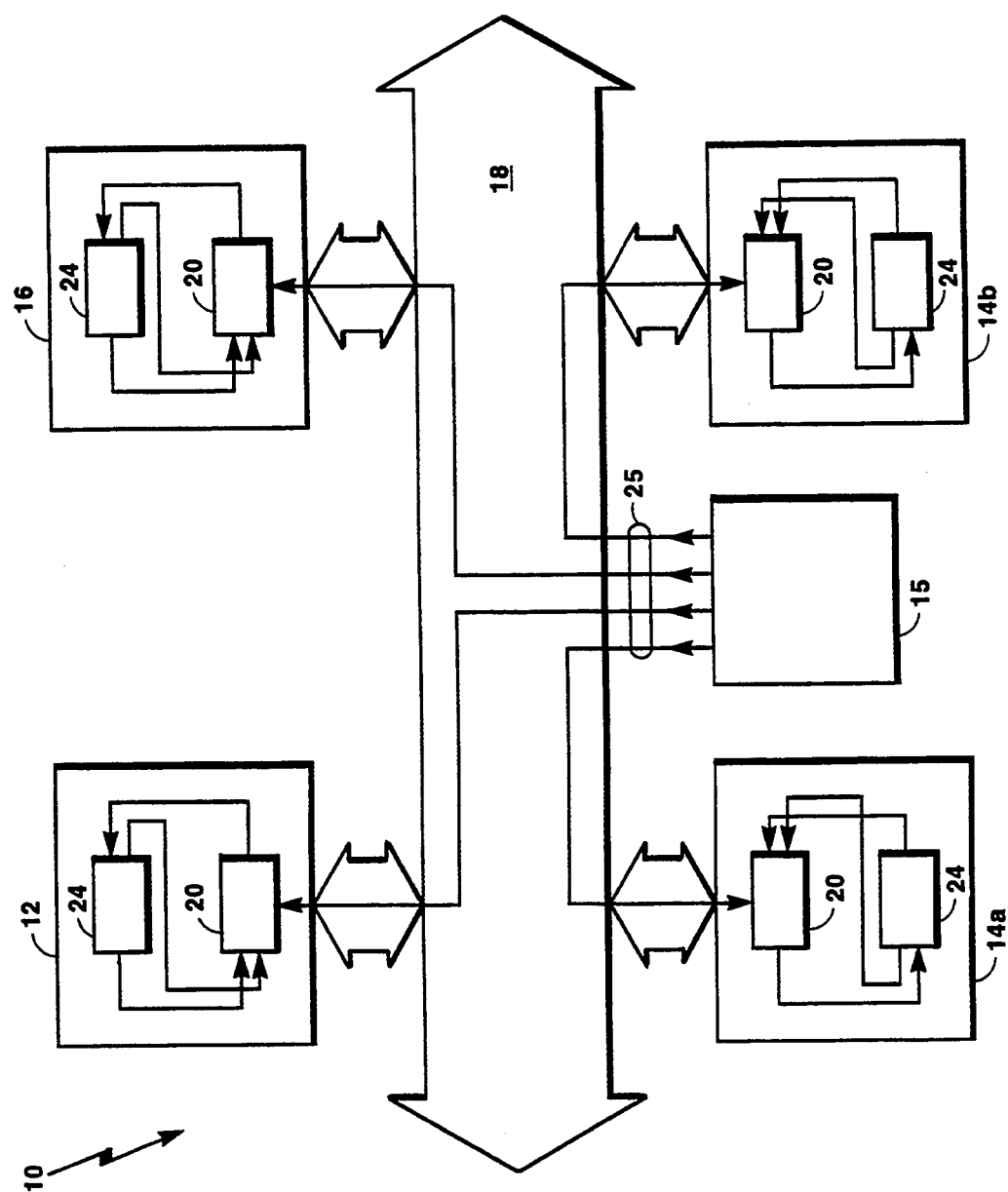
FIG. 1 is a block diagram of a computer system including modules having a clock repeater chip for receiving a globally distributed system clock signal.

Referring to FIG. 1, a synchronous computer system 10 typically includes a central processing unit module 12, main memory modules 14a, 14b and an input/output unit module 16 interconnected by a high-speed, bidirectional synchronous bus 18. A clock module 15 generates system clock signals to synchronize the bus operations of the computer system. The system clock signals are globally-distributed via separate, generally radial, unidirectional clock lines 25 of the synchronous bus 18 to each module of the computer 10.

A clock repeater chip 20 located on each module receives the distributed system clock signals as input signals. The repeater chip 20 is preferably a VLSI CMOS custom-integrated circuit chip functionally configured to process, i.e, shape and amplify, each input signal. The resulting output clock signal, which may, for example, be a pulse train having a 10 nanosecond (nsec) period, is thereafter distributed to other integrated circuits, e.g., application specific integrated circuitry (ASIC) 24, on the module. In a typical system, processing circuitry located on chip 20 converts controlled-edge, system clock signals with low-level voltages to rail-to-rail, 50% duty cycle digital pulses required by the ASIC chips 24.

Figure 2:
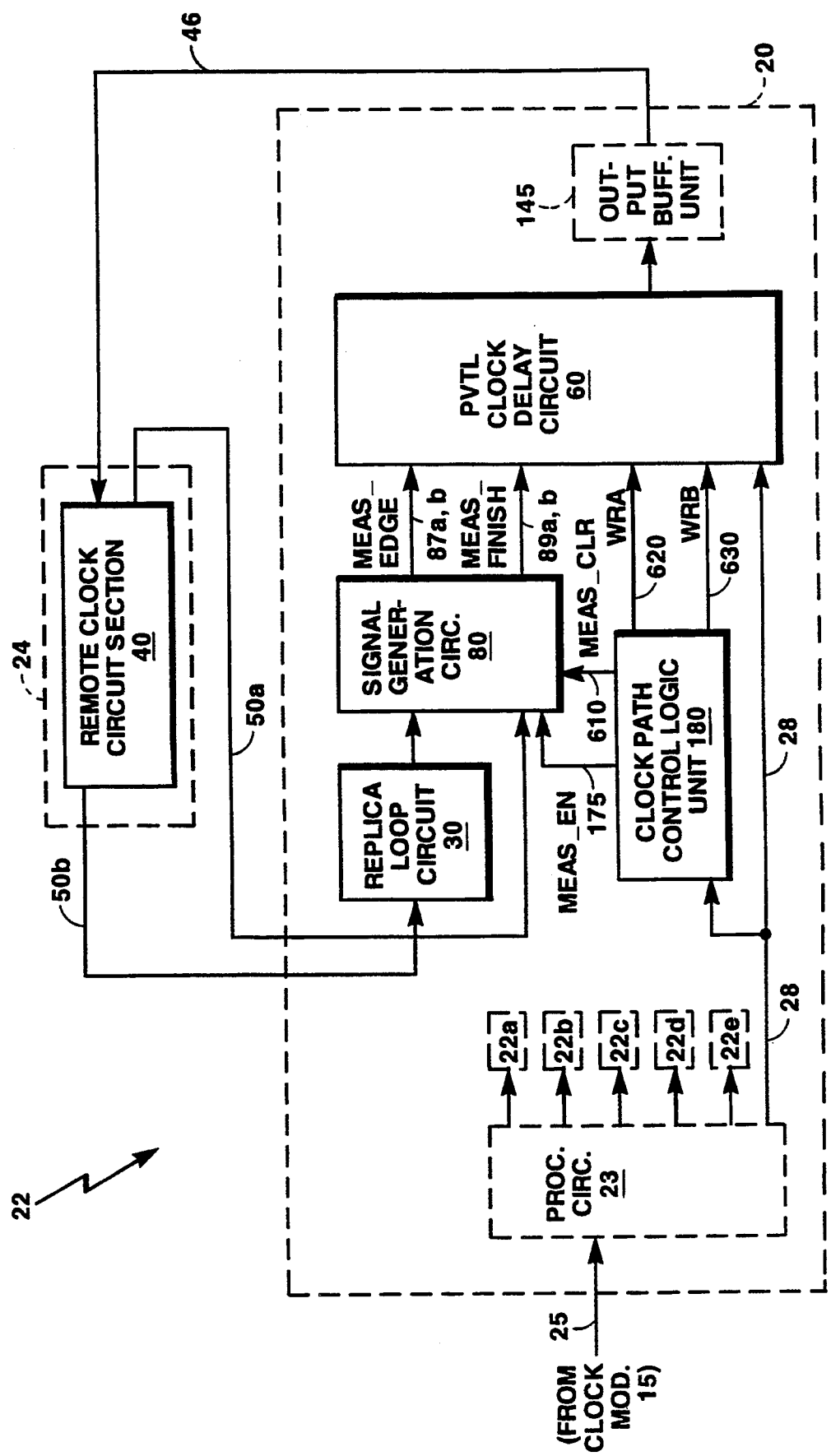
FIG. 2 is a block diagram of a remote delay regulator in accordance with the invention.

FIG. 2 is a block diagram of a remote delay regulator circuit 22 in accordance with the invention. The delay regulator 22 operates in a cyclical fashion by periodically measuring the effects of propagation delay experienced by a system clock propagating through an extended clock distribution path encompassing the repeater chip 20, an ASIC chip 24 and the clock etch transmission line 46 connecting the two chips on the same module. Specifically, the regulator 22 includes a remote clock circuit section 40 located on the ASIC chip 24, in addition to a signal generation circuit 80, a clock path control logic unit 180, a PVTL clock delay circuit 60 and a "replica loop" circuit 30 located on the repeater chip 20.

In accordance with one aspect of the invention, the regulator 22 assesses the insertion delay of the extended path introduced by two distinct semiconductor chips, i.e., the repeater chip 20 and the ASIC chip 24, and their connecting transmission line etch 46. Insertion delay is assessed by measuring the effects of the extended path's intrinsic propagation delay and subtracting the time remaining until the next clock period boundary. This approach eliminates discrepancies resulting from PVTL differences between the chips 20 and 24 when reducing clock skew in the system by regulating the insertion delay. After assessing the insertion delay, as described below, one of two delay adjusting units of the clock delay circuit 60 (see FIG. 5) is updated, while the other delay unit measures the effects of the actual propagation delay of the extended path from a previous measurement cycle. The regulator 22 updates a delay unit by adding the insertion delay, i.e., sufficient controlled amounts of unit delay, to the clock signal on line 28 using delay lines in the adjustment units.

In another aspect of the invention, the insertion delay is regulated at the "point-of-use" within the ASIC chip 24, i.e., the point in the chips's circuitry where the clock signals are actually used. For the illustrative embodiment described herein, the point-of-use is at the end of the clock distribution network located on the remote clock circuit section 40 of the ASIC chip 24. This delay-regulated clock signal also has a fixed-phase relationship with the input system clock signal on line 25 and with other regulated clock signals emanating from other repeater chips of the computer system at their points-of-use.

In the illustrative embodiment described herein, there are portions of five (5) additional remote delay regulators, designated 22a-e, located on each repeater chip 20, for a total of six (6) remote delay regulators per repeater chip. Each portion is coupled at one end to common processing circuitry 23 and at the other end to an associated ASIC chip 24 via an output buffer unit 145. The processing circuitry 23 includes differential and postamplifier circuitry for producing square wave pulses having a desired amplitude. The output buffer unit 145 includes tri-state driver circuitry used to distribute these processed signals to the ASIC chip 24.

Because of the global-clock distribution arrangement employed in the computer 10, all skew produced in the system is embedded in the repeater chips 20, the ASIC chips 24 and their connecting transmission lines 46. The fixed-phase relationship between input system clock signals on line 25 and the delay-regulated clock signals at the point-of-use on each ASIC chip 24 is maintained by adding an integer number of clock cycles of delay to each input clock signal. Since "in-phase" digital clock signals are exact images of each other, the waveforms of an undelayed clock signal and a clock signal delayed by an integer number of in-phase cycles are identical. The amount of added delay is generally based upon the intrinsic delay characteristics of each repeater chip 20, each ASIC chip 24 and each respective transmission line 46.

Figure 3:
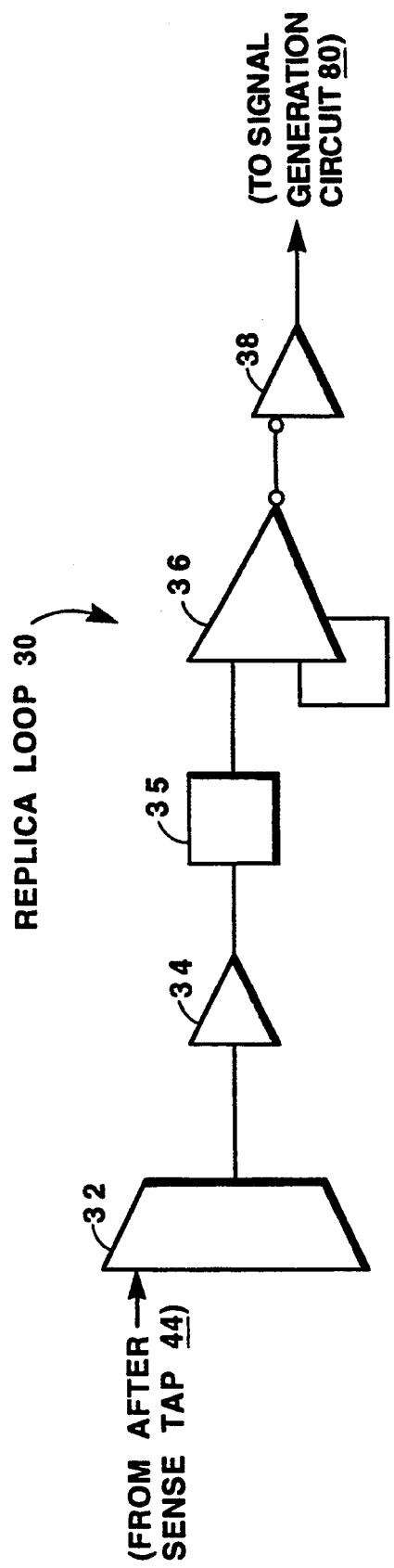
FIG. 3 is a block diagram of a replica loop of the delay regulator.

FIG. 3 is a block diagram of the replica loop circuit 30 of the delay regulator 22. The replica loop 30 simulates, in part, the logic and propagation delays of the PVTL clock circuit 60 on the repeater chip 20. Logic circuitry within the replica loop includes (i) a select and clock delay multiplexer segment 32; (ii) a tri-state output driver segment 34; (iii) a clock loading network segment 35 that typically includes an off-chip transmission line of electrical length equal to the output clock line 46; (iv) a differential amplifier segment 36; and (v) a post-amplifier stage 38. The logic 30 specifically replicates the transistor sizes and layout parasitics, together with the transmission line 46 located in the extended clock distribution path of the invention.

Figure 4:
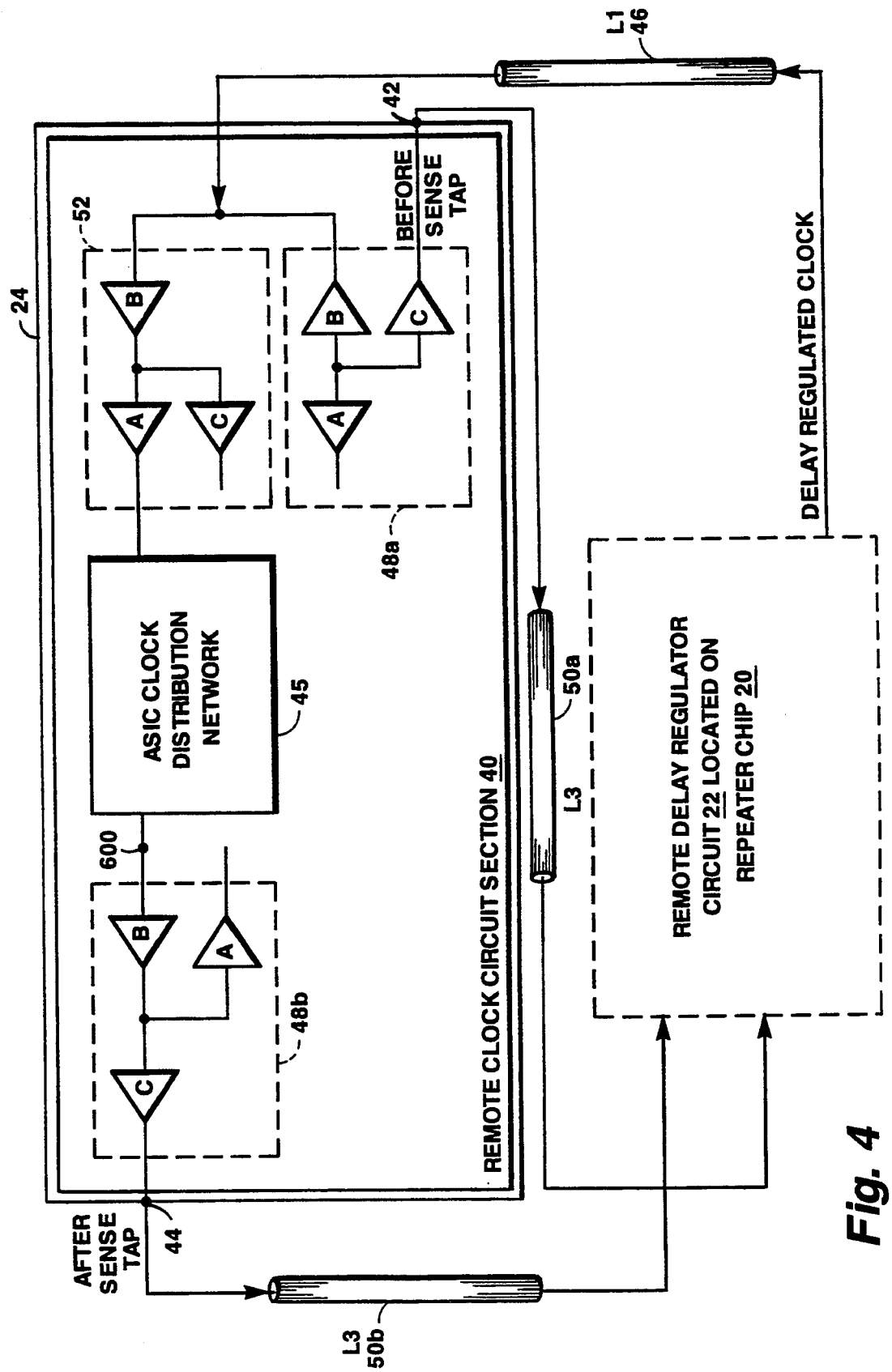
FIG. 4 is a block diagram a remote clock circuit section of the delay regulator in accordance with the invention.

FIG. 4 is a diagram of the remote clock circuit section 40 of the remote delay regulator 22, which includes the actual clock distribution network 45 of an associated ASIC chip 24. As described herein, the remote circuit 40 enables actual, as opposed to simulated, measurement of the propagation delay effects on the ASIC overhead clock distribution circuitry. In general, the ASIC chip 24 receives a delay-regulated clock signal on transmission line 46 from the repeater chip 20 and transmits two sense clock signals, i.e., a BEFORE clock signal and an AFTER clock signal on transmission lines 50a,b, to the repeater chip. This enables the remote delay regulator 22 to measure and adjust for the delay introduced by the ASIC chip 24, while compensating for the delay introduced by itself. As noted, a separate remote delay regulator is needed for each associated ASIC chip, primarily because the clock distribution delays typically vary among the ASIC chips 24 of the system 10.

In accordance with the invention, sense taps located at the beginning of the distribution network 45, i.e., the BEFORE tap 42, and at the end of the network, i.e, the AFTER tap 44, relay instances of the delay-regulated clock signal traveling through the ASIC chip network 45 to the repeater chip 20. As with the delay-regulated clock signal on line 46, the BEFORE and AFTER clock signals are nominally 10 nsec pulse trains. The sense taps enable measurement of the delay introduced by the ASIC chip 24 at the end of the clock distribution network 45, designated at 600, which is the point where the clock signal is used to perform application-specific operations with the system bus 18. The remote circuit section 40 thus eliminates the need for extending the replica loop circuit 30 onto the ASIC chip to simulate the clock distribution network 45. Such a replica loop would typically add a significant number of logic gates to the ASIC chip and consume a significant area of that chip.

The delay-regulated clock signal from the repeater chip 20 is transmitted to the associated ASIC chip 24 over a first circuit board etch transmission line 46 having an arbitrary electrical length L1. An input buffer cell 52 connects the first transmission line 46 to the beginning of the distribution network 45. One requirement of the invention is that the electrical length of the transmission line 35 in the replica loop circuit 30 be equal to the electrical length of the output clock transmission line 46 connecting the portion of the remote delay regulator 22 on the repeater chip 20 to a respective ASIC chip 24.

As noted, each respective ASIC chip has two taps, the BEFORE tap 42 and the AFTER tap 44. These taps have equivalent output buffer cells 48a,b that connect to a pair of second circuit board etch transmission lines 50a,b, each having an electrical length L3. Another requirement of the invention is that the pair of second transmission lines 50 used to transfer the delay-regulated clock signals propagating along the clock network of each ASIC chip 24 to the repeater chip 20 have an electrical length equal to L3 on a per-target basis throughout the system 10. In other words, the electrical lengths of the transmission lines 50a,b of a BEFORE and AFTER tap pair connecting the ASIC chip to its respective remote delay regulator circuit on a repeater chip 20 must be equal; however, the lengths L3 of the pair of second transmission lines can differ from one target ASIC chip to another.

The input cell 52 and each output cell 48 comprise three buffer circuits, e.g., buffers A, B and C, configured as an "equilibrating circuit". In general, buffers A and B amplify the input clock signal and ensure crisp rise and fall times on the internal clock network 45 of the ASIC chip 24. Input buffer B also drives sense output buffer C. Specifically, buffer A is configured to drive the internal clock network 45, buffer B is configured to respond consistantly to varying edge rates and buffer C is configured to drive the sense transmission lines 50a,b back to the remote delay regulator 22 on the repeater chip. The purpose of the output buffer cells 48a,b is to preserve the phase relationship between the ASIC input clock signal at the end of the transmission line 46 and the clock signal at the output of the ASIC clock distribution network 45, i.e., the point-of-use destination 600. The PVTL-dependent delay between the ASIC input clock signal and the point-of-use 600 is the key delay required for remote delay regulation.

In summary, the requirement for equivalent output buffer cells 48 and equivalent transmission lines 50 ensures that the delay introduced by the ASIC chip is accurately transmitted "off-chip" to the respective remote delay regulator circuit 22 on the repeater chip 20. Furthermore, the use of equivalent output cells and transmission lines ensures that the transmitted sense clock signals will experience the same delay and, thus, the effects of the cells and transmission lines will cancel.

Figure 5:
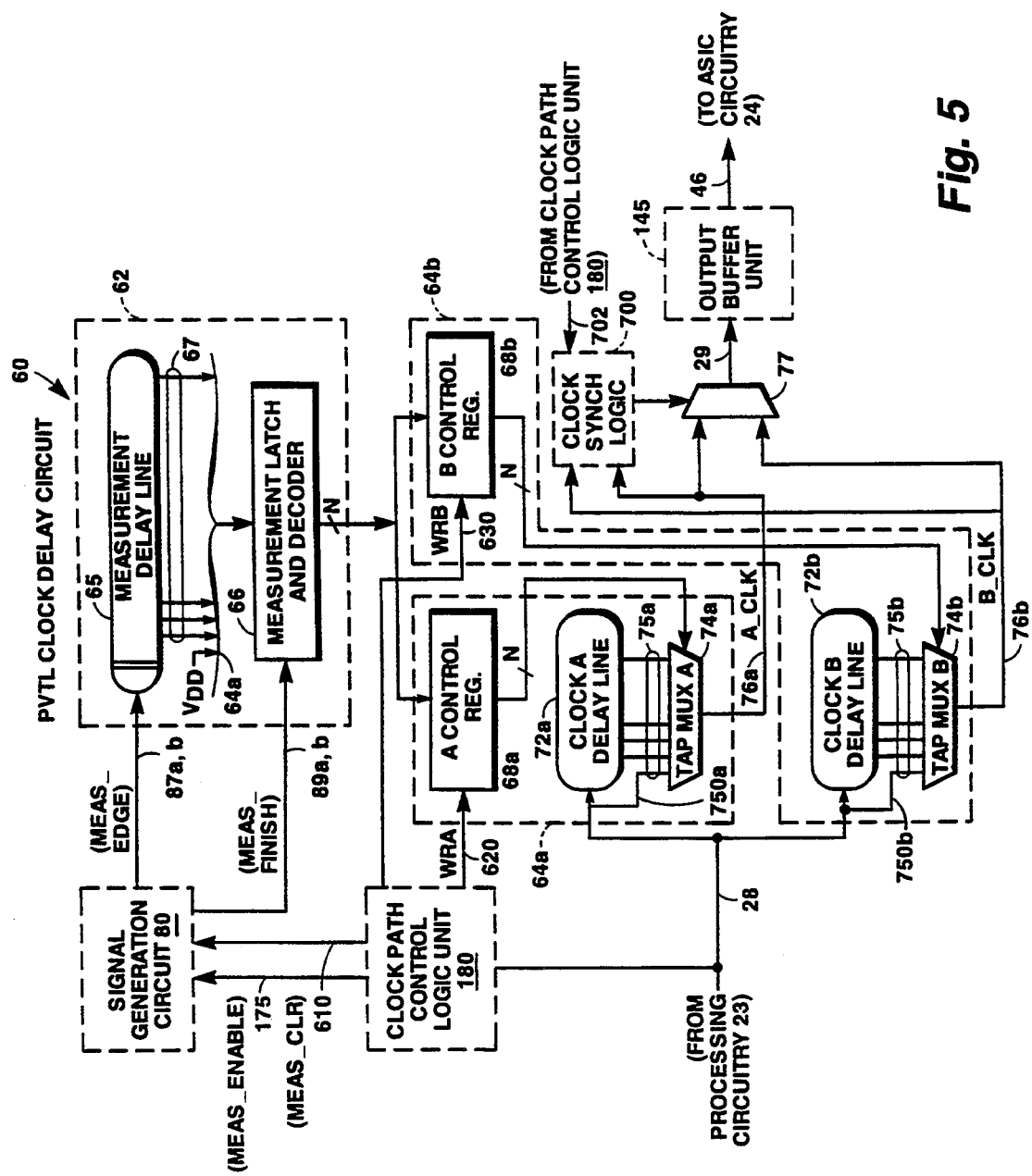
FIG. 5 is a block diagram of a PVTL clock delay circuit of the delay regulator.

A block diagram of the PVTL clock delay circuit 60 of the remote delay regulator 22 is depicted in FIG. 5. An example of another clock delay path of a delay regulator is disclosed in the article titled, CLOCK BUFFER CHIP WITH ABSOLUTE DELAY REGULATION OVER PROCESS AND ENVIRONMENTAL VARIATIONS, by Watson et al., from 1992 IEEE Custom Integrated Circuit Conference, which article is incorporated by reference as though fully set forth herein. As with the delay regulation technique disclosed in the article, the technique set forth herein provides absolute regulation of clock delay output from the repeater chip. For the present invention, the delay regulator input clock phase is maintained very close to the clock phase at the point-of-use on the remote ASIC chip. Both techniques introduce delay to align the regulated and input clock phases; however, the principal difference between the techniques concerns how the measurement is performed. The technique disclosed in the article regulates delay to a predetermined integer number of clock cycles. The technique of the present invention regulates delay to the next integral clock period using a "modulo-measurement" approach, as described below.

Figure 9:
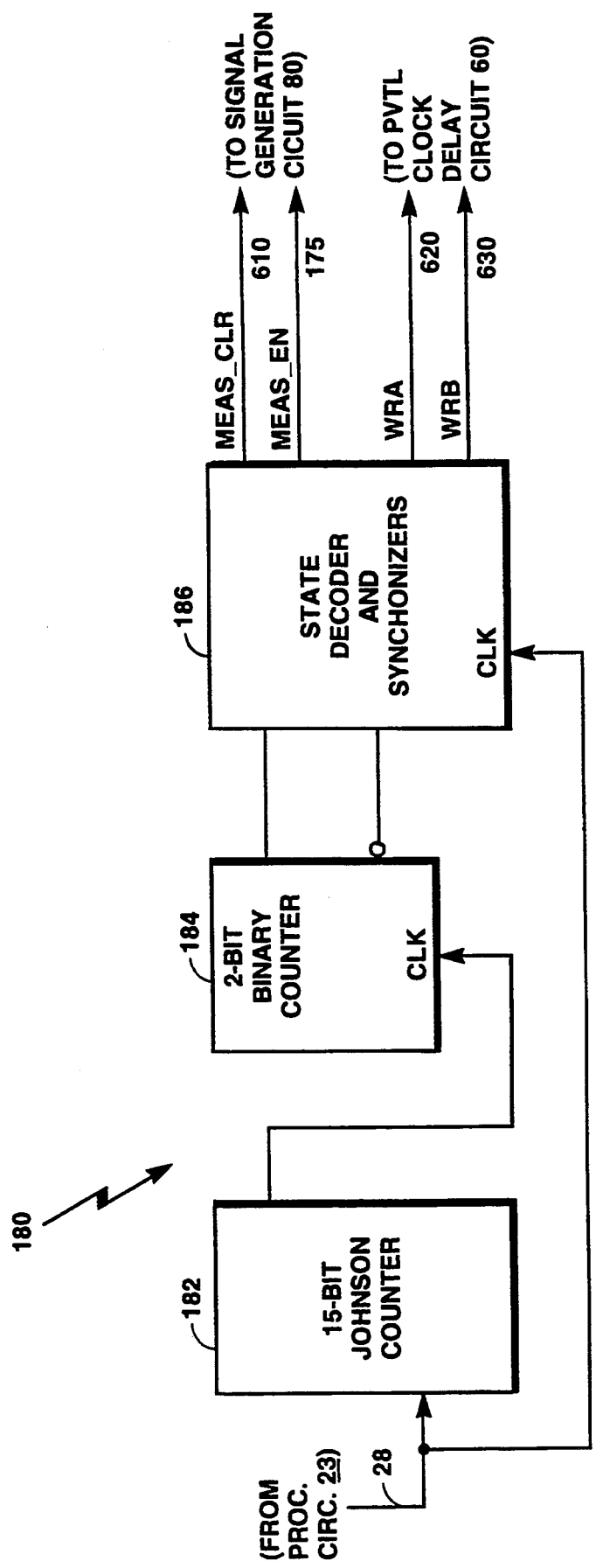
FIG. 9 is a block diagram of a clock path control logic unit of the delay regulator.

The clock delay circuit 60 includes logic circuitry used to measure and compensate for the effects of the intrinsic delay in the clock distribution path extending among the repeater chip 20, ASIC chip 24 and the etch lines connecting the chips. The data path of the delay circuit 60 is preferably three hundred and twenty-four bits wide and generally includes a measurement circuit 62 and a pair, i.e., A and B, of delay adjusting units 64a, 64b, generally designated 64. As described below in connection with FIG. 9, the intrinsic delay of the ASIC clock network, the output clock taps and the replica loop circuit change the phase relationship between the measurement signals MEAS_EDGE on lines 87a,b and MEAS_FINISH on lines 89a,b, which signals define the measured time interval. This time interval is exactly the delay that must be added in the clock delay circuit path to "align" the clock signal at the point-of-use with the input clock signal. Specifically, a tapped measurement delay line 65 captures the fractional portion of the clock period needed to complete the next clock cycle.

Figure 6:
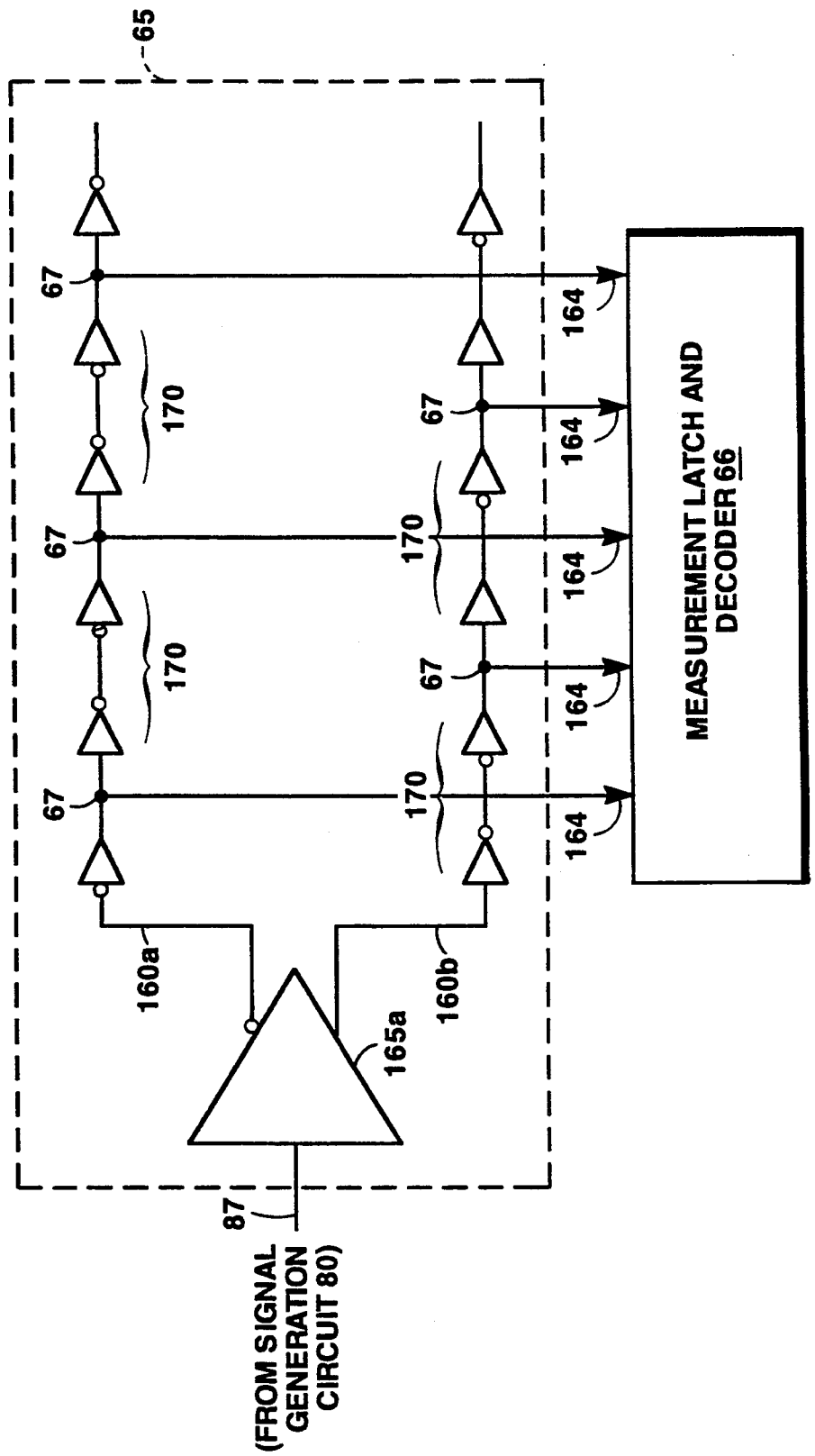
FIG. 6 is a diagram of a fine-grain, tapped delay line located within the clock delay circuit of FIG. 5.

In a preferred embodiment of the invention, the tapped delay line 65 is a fine-grain delay line shown in FIG. 6. The delay line 65 comprises two strings 160a,b of cascaded inverters, with strings 160a,b having taps 67 placed at the outputs of alternating inverter-pairs 170. This arrangement generates a digital signal at each tap output that represents propagation time in terms of a unit delay time interval, while maintaining the correct polarity from the delay line. Each of the taps 67 is coupled to a respective input 164 of a measurement latch and decoder circuit 66. In addition, a first input terminal 164a of the measurement latch circuit 66 is tied to a hardwired logical "1", e.g., $V_{DD}$. The input terminal 164a is coupled to latch cell 0, i.e., bit 0, of the measurement latch portion of circuit 66 and is always forced to a logic "1" so as to resolve a peculiar boundary condition inherent in this remote delay regulation technique: the situation where the clock signal at the point-of-use is already in phase with the reference clock signal. This situation will be discussed further below.

Specifically, the taps 67 emanating from the outputs of inverter-pairs 170 define a time interval of measurement and delay insertion that avoids circuit anomalies caused by process variations by cancelling the propagation asymmetry effects of these variations. Yet, pairing of inverters does not acheive the smallest interval or grain of time logically provided by a single inverter element. Therefore, the taps 67 from each cascaded string 160a,b are alternated at the input terminals 164 of the measurement latch and decoder circuit 66 to achieve the effects of single inverter granularity, thereby yielding a higher degree of resolution.

The delay line 65 is driven by a balancer circuit 165a that generates two logically opposing signals having substantially no skew; each opposing signal is provided to one inverter string. The resulting delay line 65 has single-inverter granularity with alternate taps, but no phase reversal, i.e., no inversion.

Figure 7:
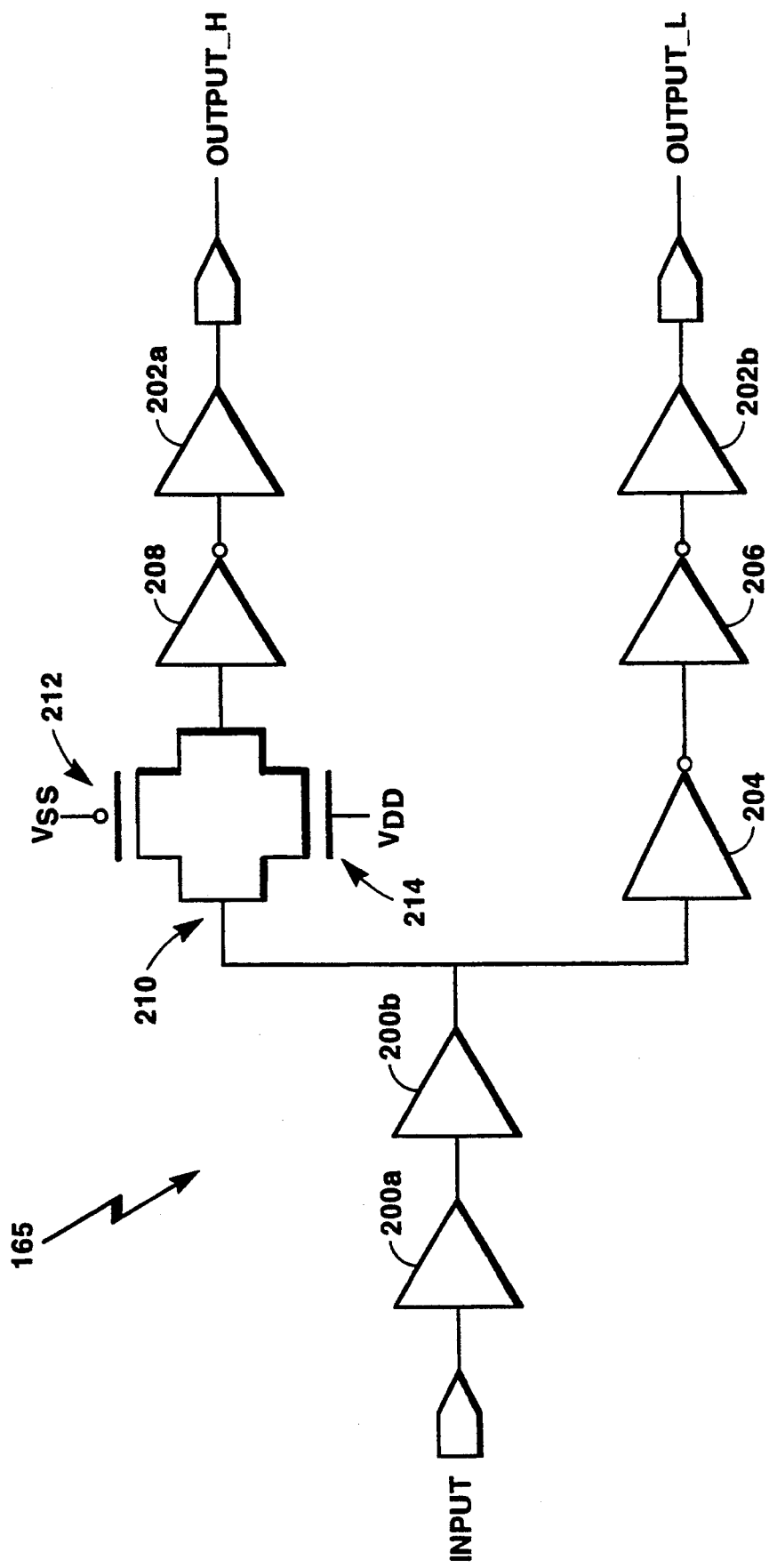
FIG. 7 is a diagram of an embodiment of a balancer circuit used in connection with the present invention.

An example of a balancer circuit 165 is shown in FIG. 7. The circuit 165 receives a single-ended INPUT signal and produces two complementary output signals, OUTPUT_H and OUTPUT_L signals. The circuit includes a pair of input buffers 200a,b, a pair of output buffers 202a,b and three inverters 204, 206 and 208, together with a PMOS device 212 and an NMOS device 214 arranged in a back-to-back pass transistor configuration 210. The latter configuration is used to create a non-inverting delay path with propagation delays similar to that of the opposing inverter path. By driving both the inverting and non-inverting paths from a common source to a common receiver, the resulting "balanced" circuit 165 minimizes fabrication variations, i.e., process corner variations, and generates output signals with substantially no skew therebetween.

Specifically, the gates of the devices in the pass transistor configuration are tied to their respective "rail" voltages, i.e., the gate of NMOS device 214 tied to $V_{DD}$ and the gate of the PMOS device 212 tied to $V_{SS}$, so that the devices are placed in their saturation regions and thus resemble active resistors. Tuning of the pass gate configuration 210 involves an RC relationship determined by the width/length ratios (P and N devices). The geometry of the gates is selected such that the intrinsic delay through them is equivalent to the delay through the opposing inverter 204.

Referring again to FIG. 5, the results of the measurement are loaded into the measurement latch and decoder circuit 66 where they are decoded by an internal decoder circuit. In a preferred embodiment of the invention, the decoder circuit (not shown) employs a conventional Johnson counter-style decoder configuration. The decoded signals are loaded into delay control registers 68a,b, generally designated 68, of the A and B delay adjusting units 64. In addition to the control registers, each delay unit 64 includes a clock delay line and a tap select multiplexer. Clock delay lines 72a,b, generally designated 72, are identical in layout and structure to measurement delay line 65. The clock delay lines 72 receive an input system clock signal on line 28. The use of two delay adjusting units 64, i.e., "double-buffering", allows the delay regulator to adjust the clock signal in one of the units by adding the desired delay, while the other unit still compensates for the previously-measured intrinsic delay of extended path. This technique contributes, in part, to a non-interrupted delay-regulated, output clock signal.

The content of each delay control register 68 enables a respective A or B tap select multiplexer 74a,b, generally designated 74, to select an appropriate tap 75a,b from its associated clock delay line 72. As with the measurement delay line 65 described previously, the A and B delay lines 72 preferably comprise two strings of cascaded inverters employing three hundred and twenty-four taps 75a, 75b located at the outputs of inverter-pairs. The selection of a tap imparts a desired amount of delay to the input system clock signal.

The resulting output clock signals, i.e., A_CLK on line 76a and B_CLK on line 76b, from the multiplexers 74 are coupled to a two-to-one clock delay multiplexer 77 that is enabled by clock synchronization logic circuit 700. Here, one of the clock signals is selected and forwarded via a delay-regulated clock path 29 to the output buffer unit 145 for distribution to ASIC circuitry 24 on the module. Selection, i.e., switching, between the clock signals is based upon a control signal, AB_SELECT, on line 702 originating from the clock path control logic unit 180, described below in connection with FIG. 9.

Figure 8:
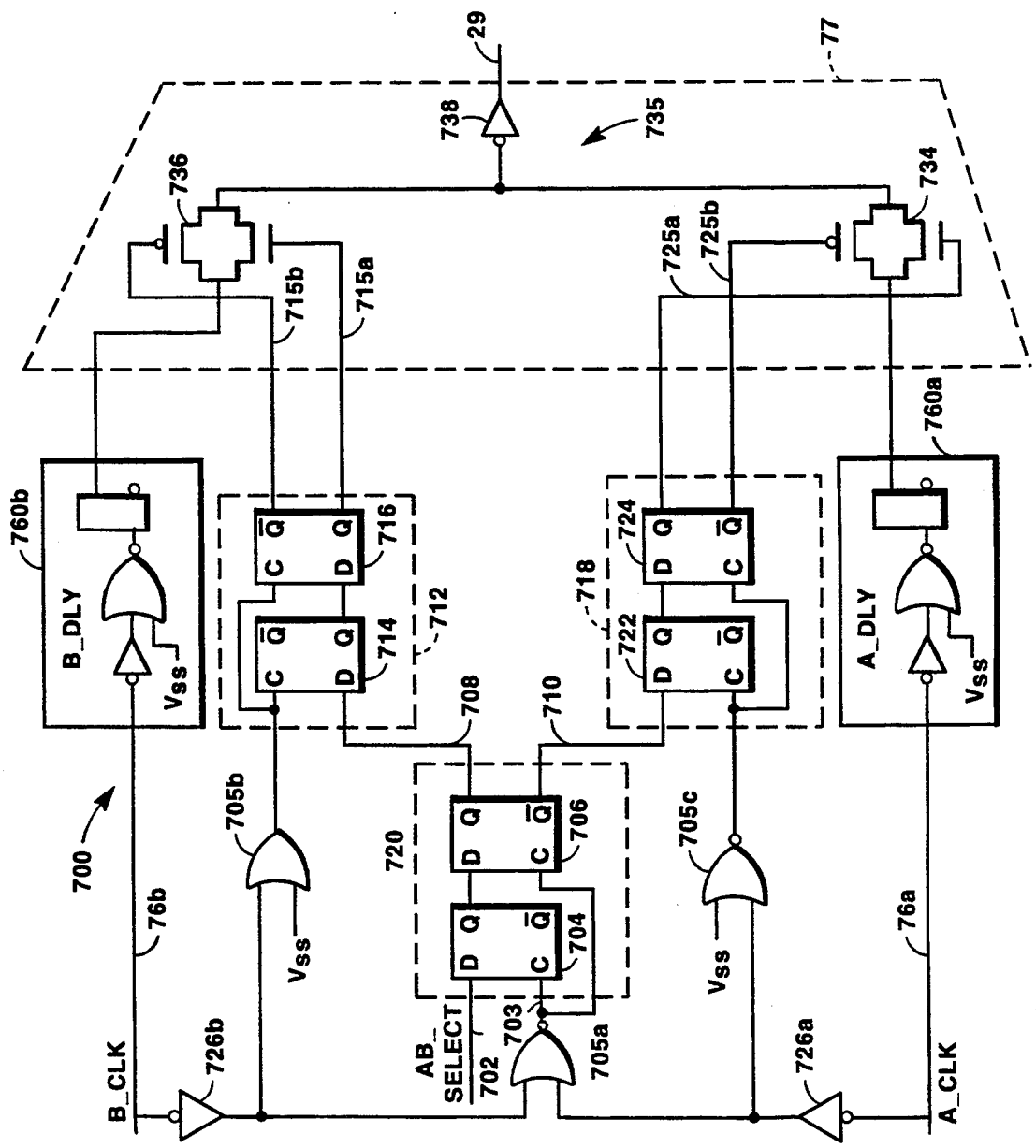
FIG. 8 is a circuit schematic of a synchronization logic circuit used in connection with the present invention.

The synchronization logic circuit 700, shown in FIG. 8, synchronizes signals having different timing domains to a single, common time domain. For example, the clock path control logic unit 180, which generates the AB_SELECT signal based on a non-delayed input clock signal on line 28, operates in a timing domain that is different from that of the delay-regulated clock signals. These latter signals, A_CLK on line 76a and B_CLK on line 76b, are separately generated clock streams that are mostly overlapping, but that have a worst-case regulation accuracy, i.e., non-overlapping streams, equal to one unit (inverter) delay of the clock delay circuit 60.

The clock synchronization logic circuit 700 synchronizes the signals using a "load cancellation" techinque described below. In general, the clock synchronizer logic circuit 700 includes a two-stage synchronization unit for generating enable signals to select an output signal from among multiple input clock signals of the delay multiplexer 77. A pre-synchronization logic stage 720 receives at its inputs the AB_SELECT signal on line 702 and an AB_CLK signal on line 703, while delivering at its outputs signals on lines 708 and 710. The AB_CLK signal is the output of a NOR gate 705a having as inputs the A_CLK and B_CLK clock signals on lines 76a and 76b, respectively, driven, via drivers 726a,b, from respective A and B tap multiplexers 74a, 74b (FIG. 5).

Each synchronization circuit is configured as a "dual-rank" synchronizer, i.e., arranged in a back-to-back, flip-flop configuration. Preferably, the flip-flops are D-type "master-slave" units with the slave latch connected to the output of the master latch.

Specifically, the AB_SELECT signal on line 702 is fed to the D-input of a first flip-flop 704 of the pre-synchronization logic unit 720; the Q-output of the flip-flop 704 is tied to the D-input of a second flip-flop 706. Both "ranks" of the pre-sychronization unit 720 are clocked by the AB_CLK signal on line 703. The Q-output on line 708 of the flip-flop 706 is fed to the D-input of a first flip-flop 714 of the B clock synchronization unit 712, while the Q-output of the flip-flop 714 is coupled to the D-input of a second flip-flop 716. The outputs of the second flip-flop 716 are B_SELECT selection enable signals on lines 715a,b. The B clock synchronization unit 712 is clocked by a modified B_CLK signal, i.e., the B_CLK signal after passing through NOR gate 705b. The modified B_CLK signal is nearly in-phase with the AB CLK signal on line 703.

Similarly, the NQ-output on line 710 of the flip-flop 706 is fed to the D-input of a first flip-flop 722 of the A clock synchronization unit 718; the Q-output of the first flip-flop 722 is coupled to the D-input of a second flip-flop 724. The outputs of the second flip-flop 724 are A_SELECT selection enable signals on line 725a,b. Both "ranks" of the clock synchronization unit 718 are clocked by the A_CLK signal modified by NOR gate 705c. The A_CLK signal at the output of NOR gate 705c is also nearly in-phase with the AB_CLK signal.

Functionally, the NOR gate 705a combines the time domains of the A_CLK and B_CLK signals for synchronization with the AB_SELECT signal at synchronizer 720. On the other hand, the NOR gates 705b,c ensure that the time domains of the clock signals entering the pre-synchronization stage 720 are the same as the time domains of those clock signals entering the synchronizers 712 and 718.

The A_SELECT and B_SELECT signals are coupled to transfer gate circuits 734 and 736, respectively, of the clock delay multiplexer 77, which operates in a timing domain different from the above synchronizers. The inputs of the transfer gates 734, 736 are connected to outputs of delay networks 760a,b, described below, while the outputs of the gates are connected to a driver 738. The gates and driver 738 are arranged in a "wire OR" configuration 735 to perform the multiplexer function. The states of the select signals control the outputs of the gates 734 and 736 as the clock delay multiplexer 77 switches between its respective input signals A_CLK on line 76a and B_CLK on line 76b. Specifically, output switching occurs on command from the AB_SELECT signal on line 702 and before a rising edge of the output signal on line 29.

In accordance with the load cancellation technique, delay networks, DLY_A 760a and DLY_B 760b, are added to the A_CLK and B_CLK signal paths, respectively, in order to bring the A and B clock synchronizer units 718, 712 and the multiplexer 77 into a common timing domain. Specifically, each delay network comprises circuits equivalent to the NOR gates 705b,c, the drivers 726b,a and second stages, i.e., the "slave" stages, of the master-slave flip-flops 716,724, respectively. This ensures that the output clock signal on line 29 does not "glitch" when the clock delay multiplexer 77 switches from one input signal to the other in higher frequency applications, e.g., 200 MHz.

Referring again to FIG. 5, the first input terminal 164a of the measurement latch portion of circuit 66 is tied to $V_{DD}$ to resolve a "boundary condition" that occurs when the clock signal at the point-of-use is already in phase with the reference clock signal. In this boundary condition case, each latch cell of the measurement latch and decoder circuit 66 captures a logical "0", because no delay adjustment is required. When the contents of the latch cells are decoded by the internal Johnson-style decoder of circuit 66, the resulting decoded signals select a tap 75 from the clock delay line 72 and no clock signal transcends the multiplexer. Therefore, no clock signal emanates from the output buffer unit 145 and the computer system 10 "shuts-down".

To avoid a boundary condition situation, a logic "1" is always forced into bit 0 of the measurement latch portion of circuit 66. Typical delay measurements will generate at least one logical "1" for storage in the latch portion of the circuit 66. If the boundary condition is encountered, the forced "1" in the bit 0 latch cell will enable the least significant tap 750, i.e., tap 0, on the clock delay line 72. Taps 0 are taps 750a,b that are positioned before the inverter elements of delay lines 72a,b. This circuit feature allows for "auto ranging" of the remote delay regulator, i.e., handling of the boundary condition without adding insertion delay.

A clock path control logic unit 180 controls the operation of the remote delay regulator 22. The control logic unit 180, shown in FIG. 9, comprises registers and combinational logic configured to produce a sequential logic circuit, i.e., a "state machine". In general, the state machine transitions unconditionally through four states, i.e., RESET, GEN_ENABLE, WRITE_AB_REG and TOGGLE_AB_SEL during a measurement cycle, while operating synchronously to the input clock signal on line 28. The functions performed and signals generated during each of the four states are as follows:

1. RESET: generates the signal MEAS_CLR on line 610 to clear the signal generation circuitry which, in turn, clears the measurement latch;

2. GEN_ENABLE: generates the signal MEAS_EN on line 175 for the signal generation circuitry;

3. WRITE_AB_REG: generates the signals WRA on line 620 and WRB on line 630 to write the measurement word into either the A or B register; and 4. TOGGLE_AB_SEL: generates the control signal AB_SELECT on line 702 to toggle the clock delay multiplexer and select either the A_CLK or B_CLK signals.

In an exemplary embodiment of the control logic unit 180, the state machine includes one 15-bit Johnson counter 182 cascaded with a 2-bit binary counter 184 and thereafter coupled to a state decoder and synchronizer circuit 186. Specifically, the Johnson counter 182 comprises fifteen D-type flip-flops configured as a shift register with the Q (bar) output of the last flip-flop tied to the data input of the first flip-flop. The 2-bit binary counter 184 comprises two D-type flip-flops and the synchronizer circuit 186 includes a plurality of dual-rank synchronizer circuits. A toggle flip-flop, included within the synchronizer circuit 186, operates to designate which delay adjusting unit 64 is selected to store the next insertion delay measurement and which unit is to generate the output clock signal on line 29 (see FIG. 5) based on a previous measurement.

Figure 10:
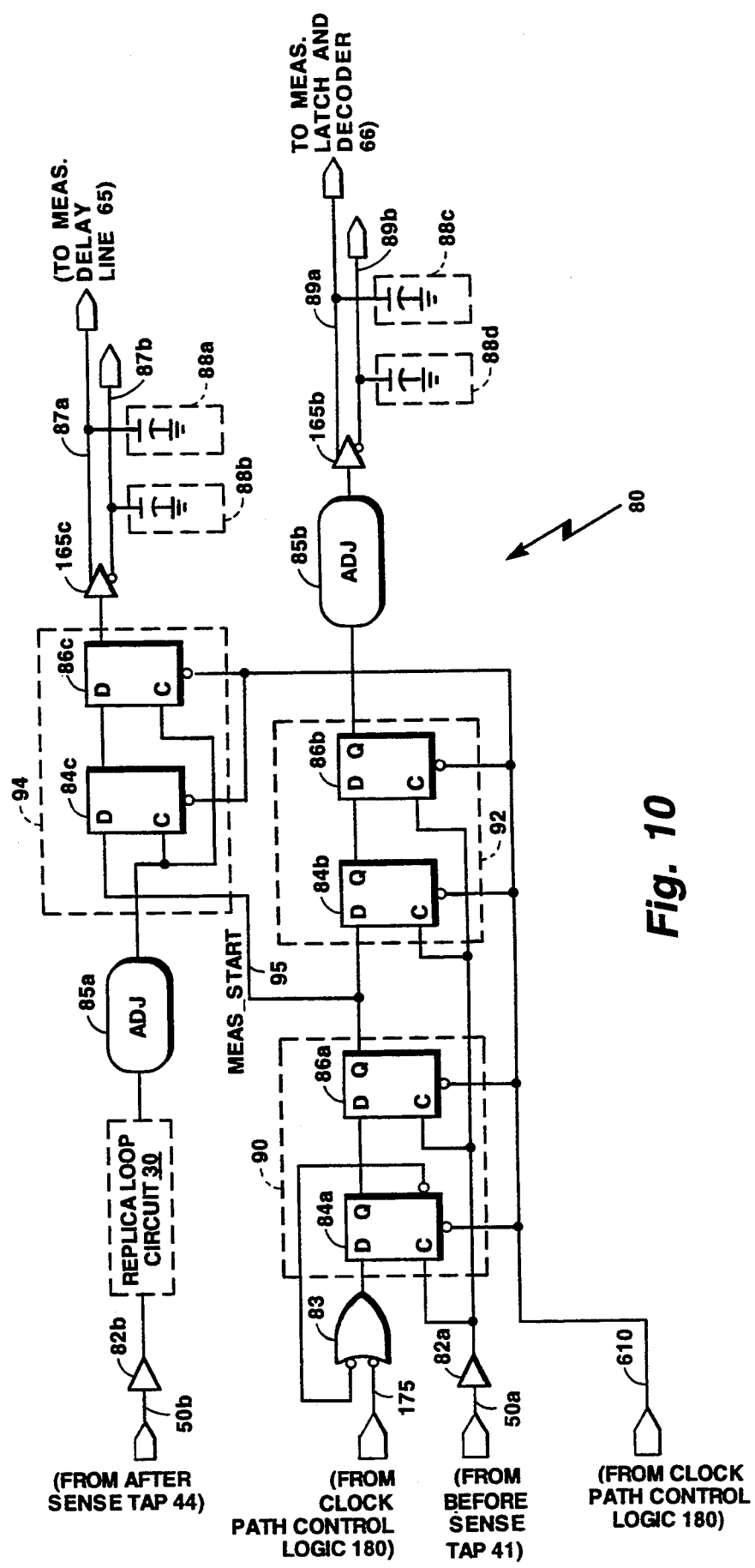
FIG. 10 is a block diagram of a signal generation circuit of the delay regulator.

FIG. 10 illustrates an embodiment of the signal generation circuit 80 of the remote delay regulator 22, which comprises dual-rank synchronizers 90, 92 and 94. The primary purposes of the signal generation circuit 80 are (i) to precisely define a delay regulation measurement period at the frequency of circuit operation and (ii) to precisely define a signal within this period that is used to measure the inherent delay of the extended clock distribution path. Specifically, the rising edges of a MEAS_START signal on line 95 and MEAS_FINISH signals on lines 89a,b define the beginning and end of a delay regulation measurement cycle, while the signals MEAS_EDGE on lines 87a,b provide the basis for the measurement.

As noted, the state machine generates various control and timing signals such as MEAS_CLR, WRA, WRB and MEAS__EN. Specifically, the measurement enable signal MEAS_EN is approximately thirty system clock cycles in duration and is used in conjunction with the signal generation circuit 80 to generate the MEAS_START and MEAS_FINISH signals. The signal generation circuit 80 thus eliminates the need for a measurement pulse generator of the type disclosed in the above-mentioned article.

Since it is based upon the system clock signal, MEAS_EN must be synchronized to a time domain that reflects the delay introduced by the extended clock distribution path. That time domain is the BEFORE clock time domain and synchronization is performed with the synchronizer circuits.

Each synchronizer consists of two D-type flip-flops 84 and 86 arranged in a back-to-back configuration. Specifically, the BEFORE clock signal on line 50a from the sense tap 42 enters the portion of the remote delay regulator located on the repeater chip 20 through an input buffer 82a and is provided to the clocking input terminals of the flip-flops 84a and 86a of the synchronizer 90. The MEAS_EN signal on line 175 is provided to the data input terminal of the first flip-flop 84a, whose output is coupled to the data input terminal of the second flip-flop 86a. The output of this latter flip-flop is the MEAS_START signal on line 95, which is then provided to the data input terminals of synchronizers 92 and 94.

The flip-flops constituting the synchronizers 90, 92 and 94 operate on only one signal edge. The edge is preferably the rising of the signal, but it could also be falling edge, depending upon the system requirements. In this manner, all the flip-flops "feel" the same, thereby eliminating any effects of fabrication process tolerances.

The BEFORE clock signal on line 50a is also provided at the clocking terminals of the flip-flops of synchronizer 92, the output of which is connected to the input of a second balancer circuit 165b via an adjustment delay circuit 85b. The balancer circuit 165b (see FIG. 7) produces logically opposing signals MEAS_FINISH on lines 89a,b that are then provided to the measurement latch and decoder circuit 66 (FIG. 5), as described further below.

The AFTER clock signal on line 50b enters the remote regulator through an input buffer 82b and then propagates through the replica loop circuit 30. The output of the replica loop 30 is coupled to the clocking input terminal of flip-flop 84c of the synchronizer 94 via an adjustment delay circuit 85a. The functions and contents of the adjustment delay circuits 85a,b are described below in connection with FIGS. 10 and 11. The output of flip-flop 86c is connected to another balancer circuit 165c that produces complementary, logically opposing signals MEAS_EDGE on lines 87a,b.

In order to provide an accurate measurement of the PVTL delay introduced by the ASIC and repeater chips, the phase relationship between the BEFORE and AFTER clock signals must be maintained throughout the signal generation circuit 80 and, furthermore, must be identical to the phase relationship between the MEAS_EDGE and MEAS_FINISH signals. Unavoidable delays, introduced by the second stage of the flip-flop 86a and the first stage of the flip-flop 84c, distort this required relationship. Therefore, adjustment delay circuits ADJ 85, comprising portions of a transparent latch circuit, are used to offset these delays.

Figure 11:
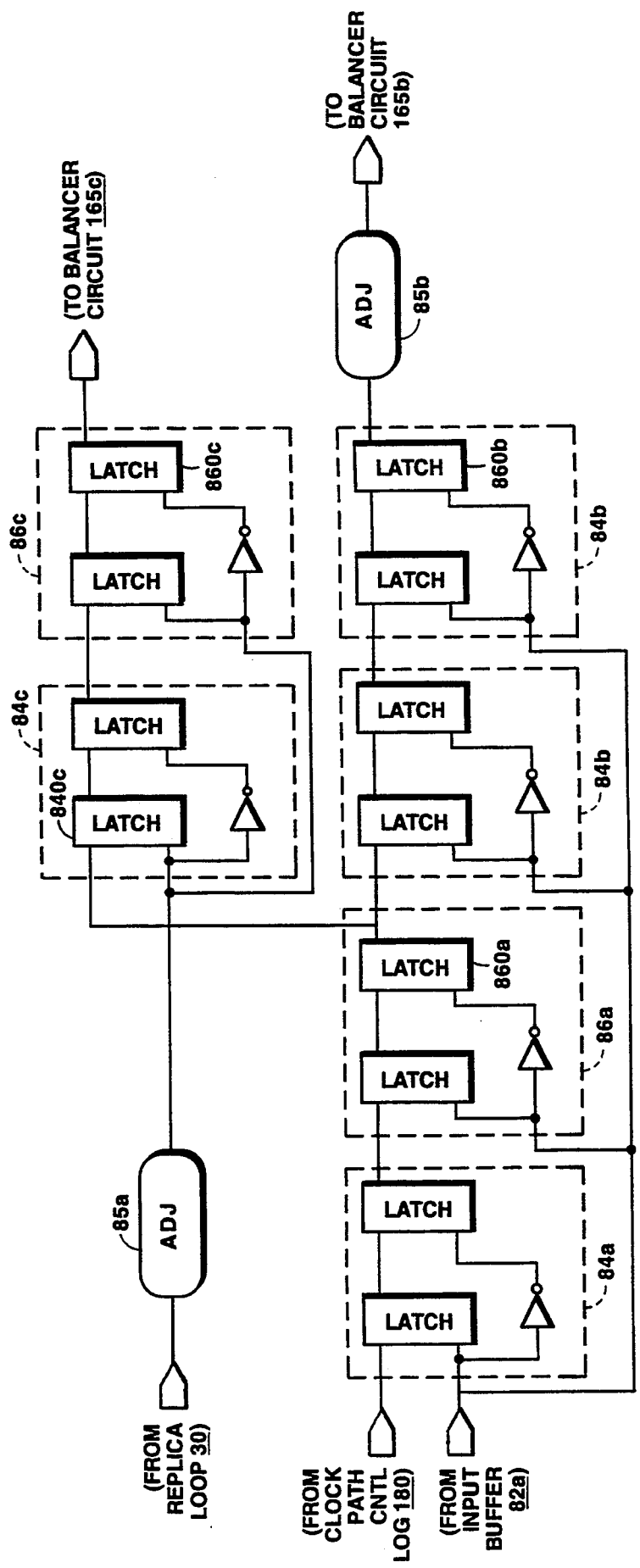
FIG. 11 is a circuit level diagram of a synchronizer portion of the signal generation circuit of FIG. 10.

FIG. 11 shows that each flip-flop of the synchronizers comprise two latches arranged in a master/slave configuration. The clocking input-to-Q output portion of the latch 860a and the data input-to-slave output portion of the latch 840a constitute timing delays that are unavoidable if the function of the signal generation circuit 80 is to be realized. Specifically, these latch circuits disrupt the phase relationship between the BEFORE and AFTER clock signals, and the signals they generate, because the delays that the latches introduce are not "offset" by equivalent delays in the circuit 80. Accordingly, the adjustment delay circuits 85 are inserted into the circuit 80 to maintain the relative phase relationship of these signals up to their points of destination, i.e., the measurement delay line and measurement latch.

Figure 12:
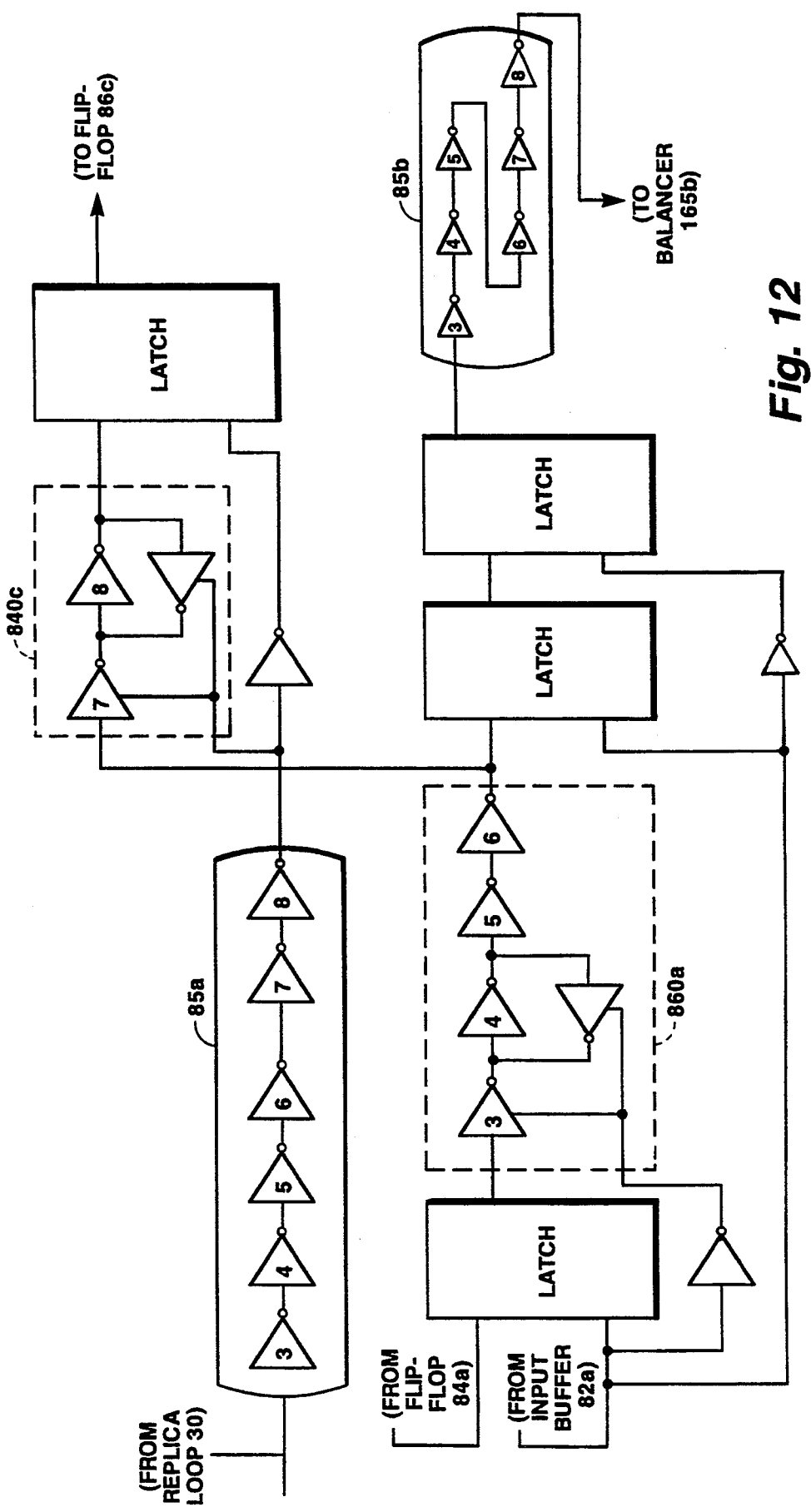
FIG. 12 is a schematic diagram showing adjustment delay circuits added to the signal generation in accordance with the invention.

Referring also to FIG. 12, the inherent timing delays introduced by the clocking input-to-Q output portion of latch 860a is represented by a four-inverter error delay <3-6>; these delay elements are reproduced in the adjustment delay circuit 85a.

There is also a critical timing issue involving the MEAS_START signal on line 95. Here, it is not known when MEAS_START will appear within the time domain of the AFTER clock signal because the relative phase of this latter signal is shifted by the replica loop 30. The set-up and hold times of the latch 840c contribute a two-inverter error delay <7-8> at this latch's data input-to-slave output circuit; this error delay could manifest as a race condition. These two-inverter delay elements are similarly reproduced in the adjustment delay circuit 85a.

However, the addition of delay circuit 85a into the signal generation circuit 80 alters the MEAS_START-to-MEAS_EDGE timing interval within the measurement period defined by MEAS_START and MEAS_FINISH. To maintain the required timing interval, generation of the MEAS_FINISH signals must be delayed a period of time equivalent to the delay elements of adjustment delay circuit 85a. Therefore, an adjustment delay circuit 85b, which is electrically equivalent to the circuit 85a, is inserted at the output of the synchronizer 92. This preserves the required timing integrity between the clock signals driving the measurement delay line and measurement latch circuit 66.

Referring again to FIG. 10, the balancer circuit 165c located at the output of the synchronizer circuit 94 drives the measurement delay line 65 and the balancer circuit 165b drives a bank of individual latches located in the measurement latch portion of circuit 66. This latter circuit represents a large amount of both line and device capacitance. To offset the capacitive effect of circuit 66, loading networks 88a,b, which are preferably capacitors of values equal to at least the measurement latch capacitance of circuit 66, are placed at the outputs 87a,b of the balancer 165c. However, the capacitive loads driven by the balancer circuit 165b may be different; therefore, "tuning" capacitor networks 88c,d may be placed at the outputs 89a,b of circuit 165b to balance these outputs. It should be noted that the aggregate value of capacitors 88c,d, if any, is factored into the ultimate value of the capacitors of loading networks 88a,b to ensure a balanced condition between the outputs of the circuits 165b,c.

The operation of the remote delay regulator 22 during a delay measurement cycle will now be described with reference to the drawings. The BEFORE clock signal on line 50a is routed from the sense tap 42 on the ASIC chip 24 to the signal generation circuit 80 of the remote regulator 22 located on the repeater chip 20. Here, the MEAS_EN signal on line 175 is synchronized to the BEFORE time domain and then transformed into a MEAS_START signal on line 95. MEAS_START defines the beginning of a measurement interval.

As noted, the AFTER clock signal on line 50b is provided at a sense tap 44 on the ASIC chip 24 located at the end of the ASIC clock distribution network 45, i.e., at the clock signal's point-of-use 600. The skew present in the distribution network thus delays the AFTER signal by some fraction of a system clock cycle and the present invention is specifically directed to regulating this delay. The AFTER signal is routed from the tap 44 to the replica loop circuit 30, where the inherent propagation delay of the delay regulator further delays the signal.

Thereafter, the AFTER signal is provided to the synchronizer 94, which synchronizes the MEAS_START signal to the AFTER clock time domain and eventually generates the MEAS_EDGE signals on lines 87a,b. The MEAS_EDGE signals propagate into the tapped measurement delay line 65 where a measurement of the intrinsic propagation delays of the extended path encompassing the ASIC chip 24, the repeater chip 20 and the intervening etch line is provided.

It should be noted that only the leading edges of the MEAS_EDGE signals are sent through the tapped delay line 65. Meanwhile, synchronizer 92 ensures that the measurement latch portion of circuit 66 is closed one full clock cycle after the assertion of MEAS_START, thereby providing a measurement cycle of one system clock cycle in duration. Thus, when MEAS_START is present at the data input of synchronizer 94, the next two BEFORE clock signals generate MEAS_FINISH signals on lines 89a,b to close the measurement latch. Two clock signals are required because, as noted, the synchronizer is "dual-ranked". Specifically, the leading edges of the MEAS_FINISH signals are used to close the measurement latch portion of circuit 66. The digital word captured in the measurement latch reflects an integer number of clock periods minus the delay of the repeater chip 20, the output clock transmission line and the associated ASIC chip's clock distribution network 45 rounded down to the nearest delay line delay unit, e.g., 200 ps.

The delay-regulated output signal on line 46 of the repeater chip then drives the remote section 40 of the associated ASIC chip 24. This delay-regulated signal ensures that the clock signal at the end of the clock distribution network 45, i.e., point-of-use 600 (see FIG. 4), in the ASIC chip 24 is delayed by approximately one clock period or integral multiple of clock periods. The added delay enables clock signal alignment throughout the system of up to one unit of delay less, e.g., 200 ps. Therefore, clock signals with negligible amounts of skew can be achieved throughout the system at the end of all the ASIC chip clock distribution networks. Another requirement of the invention is that each associated ASIC chip must provide the BEFORE and AFTER sense taps. The technology used in the ASIC chip may be different from that of the clock repeater chip, provided signal levels are compatible.

While there has been shown and described a preferred embodiment, it is to be understood that various other adaptations and modifications may be made within the spirit and scope of the present invention. For example, the invention is equally applicable to a two-stage delay regulator where the first stage is used to remove the propagation delay variations introduced by the clock repeater chip itself, i.e., a "single-barreled" regulator, and the second stage is "multi-barreled", e.g., several cascaded regulators with parallel inputs and separate outputs. Here, each second stage regulator accommodates a separate associated ASIC chip.

The two-stage regulator requires that the transmission line used to deliver delay-regulated clock signals to the associated ASIC chip have an electrical length L1 that is consistent throughout the system. Additionally, each associated ASIC chip has BEFORE and AFTER taps buffered by equivalent output drivers to two transmission lines of electrical length L3, which deliver instances of the delay-regulated clock signals back to the repeater chip. Again, the lengths L3 must be consistent on a per-target basis, although they may differ from one ASIC chip to another.

At the repeater chip, the BEFORE clock signal is routed to a dedicated measurement latch and decoder circuit for each associated ASIC chip and the AFTER clock signal is routed to a dedicated measurement delay line for each target chip. Specifically, the incoming tap sense clocks are divided by two with toggle flip-flops, e.g., one-bit Johnson counters, to obtain pulses one clock cycle in length before entering the measurement latch or delay line. These clock-period long pulses determine latency deliberately inserted into each associated ASIC clock signal. The BEFORE signal is used to close the measurement latch and the AFTER signal, delayed by the target ASIC chip's clock distribution network, drives the measurement delay line.

Thus, the first stage of the regulator measures and corrects for delay variations between repeater chips of the system due to PVTL variations, while the second stages measure and correct for the delay of each associated ASIC chip's clock distribution network over PVTL variations.

The foregoing description has been directed to a specific embodiment of this invention. It will be apparent, however, that variations and modifications may be made to the described embodiment, with the attainment of some or all of its advantages. Therefore, it is the object of the appended claims to cover all such variations and modifications as come within the true spirit and scope of the invention.

What is claimed is:

1. Apparatus for reducing clock skew in a computer by measuring effects of intrinsic propagation delays of an extended clock distribution path encompassing a clock repeater chip, a clock transmission line and an associated integrated circuit (IC) chip, and adjusting an input system clock signal to deliver a low-skew clock signal to point-of-use circuitry on the IC chip, said apparatus comprising:

a clock delay circuit located on the repeater chip for measuring and compensating for the effects of intrinsic propagation delays of said extended path during a measurement cycle, said clock delay circuit configured to receive the system clock signal and provide the low-skew clock signal to said point-of-use circuitry on the associated IC chip;

a remote clock circuit located on the associated IC chip for measuring the actual propagation delay effects of a clock distribution network used to distribute the low-skew clock signal on the IC chip, the point-of-use circuitry being connected to the end of the distribution network, said remote circuit receiving the low-skew clock signal from said clock delay circuit over a first transmission line; and a signal generation circuit located on the repeater chip and coupled between said clock delay circuit and said remote circuit for generating measurement signals that define the beginning and end of the measurement cycle in response to instances of the low-skew clock signal received from said remote circuit over a pair of second transmission lines, whereby the time between said instances of the low-skew clock signal represents the propagation delay of the clock distribution network on the associated IC chip.

2. The apparatus of claim 1 wherein said remote clock circuit further comprises:

an input buffer cell coupled between said first transmission line and the beginning of the clock distribution network;

a plurality of sense taps connected to said pair of second transmission lines; and a plurality of output buffer cells coupled between said pair of second transmission lines and said sense taps.

3. The apparatus of claim 2 wherein said sense taps include a before sense tap connected to an input of the clock distribution network and an after sense tap connected to an output of the distribution network, and wherein said second transmission lines include a before transmission line connected to said before sense tap and an after transmission line connected to said after sense tap.

4. The apparatus of claim 1 further comprising a clock path control logic unit located on the repeater chip and coupled to said clock delay circuit and said signal generation circuit for generating signals that control the operation of said clock delay circuit and said signal path generation circuit during the measurement cycle.

5. The apparatus of claim 3 further comprising a clock path control logic unit located on the repeater chip and coupled to said clock delay circuit and said signal generation circuit, said clock path control logic unit being operated synchronously to said system clock signal and being configured to generate signals that control the operation of said clock delay circuit and said signal path generation circuit during the measurement cycle.

6. The apparatus of claim 5 wherein one of said signals generated by said clock path control logic unit circuit is a measurement enable signal synchronized to a time domain reflecting the intrinsic propagation delays of said extended clock distribution path.

7. The apparatus of claim 6 further comprising a replica loop circuit located on the repeater chip and including circuits that simulate, in part, the logic and propagation delays of said clock path circuit, said replica loop circuit being coupled at an output to said signal generation circuit and being coupled at an input to said remote clock circuit by said after transmission line.

8. The apparatus of claim 7 wherein said instances of the delay-regulated clock signals include:

a before clock signal transmitted by one of said output buffer cells over said before transmission line to said signal generation circuit; and an after clock signal transmitted by the other of said output buffer cells over said after transmission line to said replica loop circuit.

9. The apparatus of claim 8 wherein said clock delay circuit comprises a measurement delay line having an input coupled to said signal generation circuit and an output coupled to a measurement latch and decoder circuit.

10. The apparatus of claim 9 wherein said signal generation circuit comprises a first synchronizer circuit configured to produce a measurement start signal in response to synchronizing said measurement enable signal to said before clock signal, said measurement enable signal being provided at a data input of said first synchronizer circuit and said before clock signal being provided at a clocking input of said first synchronizer circuit, whereby said measurement start signal defines the beginning of the measurement cycle.

11. The apparatus of claim 10 wherein said signal generation circuit further comprises a second synchronizer circuit coupled to a first balancer circuit so as to produce logically opposing measurement edge signals at the outputs of said first balancer circuit in response to synchronizing said measurement start signal to said after clock signal, said measurement start signal being provided to a data input of said second synchronizer circuit and said after signal being provided from the output of said replica loop circuit to a clocking input of said second synchronizer circuit, said measurement edge signals being provided to said measurement delay line.

12. The apparatus of claim 11 wherein said signal generation circuit further comprises a third synchronizer circuit coupled to a second balancer circuit so as to produce logically opposing measurement finish signals at the outputs of said second balancer circuit in response to synchronizing said measurement start signal to said before clock signal, said measurement start signal being provided to a data input of said third synchronizer circuit and said before signal being provided to a clocking input of said third synchronizing circuit, said measurement finish signals being provided to said measurement latch and decoder circuit.

13. The apparatus of claim 12 wherein said measurement latch and decoder circuit is coupled to a plurality of delay adjusting units, each of said delay adjusting units including a tapped delay line coupled to a tap select multiplexer that adds insertion delay to the system clock signal and that produces a delay-regulated clock signal.

14. The apparatus of claim 13 wherein said tapped delay line comprises a plurality of strings of cascaded inverters, with each of said strings having taps placed at outputs of alternating inverter pairs.

15. The apparatus of claim 14 further comprising a clock delay multiplexer having as inputs said delay-regulated clock signal produced by each of said delay adjusting units and having as an output said low-skew clock signal.

16. The apparatus of claim 15 further comprising a synchronization logic unit for enabling said clock delay multiplexer to switch between said delay-regulated input clock signals without disturbing said low-skew output clock signal, said synchronization logic unit synchronizing said low-skew output clock signal to a selection control signal generated by said clock path control logic unit.

17. The apparatus of claim 16 wherein said synchronization logic unit comprises a plurality of clock synchronization units coupled to transfer gate circuits of said clock delay multiplexer, each of said clock synchronization units having two flip-flop units arranged in a back-to-back configuration, wherein each flip-flop unit comprises a master latch stage coupled to a slave latch stage.

18. The apparatus of claim 17 wherein said synchronization logic unit further comprises a delay network coupled to each of said delay-regulated clock signals for gathering said clock synchronization units and said clock delay multiplexer into a common timing domain.

19. The apparatus of claim 18 wherein said delay network comprises a driver circuit connected to a replicated slave latch stage via a NOR gate.

20. The apparatus of claim 19 wherein each of said balancer circuits comprises a pair of input buffers connected to a pair of output buffers via a plurality of inverters and a pass transistor, said pass transistor comprising a PMOS device and an NMOS device arranged in a back-to-back configuration.

* * * * *